United States Patent
Steffan et al.

(10) Patent No.: US 6,238,940 B1
(45) Date of Patent: May 29, 2001

(54) INTRA-TOOL DEFECT OFFSET SYSTEM

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/304,420

(22) Filed: May 3, 1999

(51) Int. Cl.[7] .................................................. H01L 31/26
(52) U.S. Cl. ............................................. 438/14; 438/18
(58) Field of Search ................................. 438/12, 14, 15, 438/18, 16, 5, 17

(56) References Cited

U.S. PATENT DOCUMENTS

| | | | |
|---|---|---|---|
| 5,761,064 | * 6/1998 | La et al. | 364/468.17 |
| 5,777,901 | * 7/1998 | Berezin et al. | 364/578 |
| 5,913,105 | * 6/1999 | McIntyre et al. | 438/16 |
| 6,067,507 | * 5/2000 | Beffa | 702/118 |

* cited by examiner

Primary Examiner—David Nelms
Assistant Examiner—David Nhu
(74) Attorney, Agent, or Firm—H. Donald Nelson

(57) ABSTRACT

A method of analyzing defects in a semiconductor manufacturing process by removing position offset of a selected scanning tool from the defect location information and adding position offset of a selected review analysis tool. The resulting defect location information from a scanner is based upon a true xy coordinate system and the analysis review tool reviews defect locations based upon its xy coordinate system.

6 Claims, 3 Drawing Sheets

INTRA-TOOL DEFECT OFFSET SYSTEM

BACKGROUND OF THE INVENTION

1. Field of the Invention

This invention relates generally to the manufacture of high performance semiconductor devices. More specifically, this invention relates to the detection and review of defects during the manufacture of high performance semiconductor devices. Even more specifically, this invention relates to the detection and review of defects during the manufacture of high performance semiconductor devices utilizing scan tool offset and review tool offset data to ensure accurate registration of tools when the semiconductor wafer is placed in different tools.

2. Discussion of the Related Art

In order to remain competitive, a semiconductor manufacturer must continuously increase the performance of the semiconductor integrated circuits being manufactured and, at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As known in the semiconductor manufacturing art, the yield of chips (also known as die) from each wafer is not 100% because of defects caused during the manufacturing process. The number of good chips obtained from a wafer determines the yield. As can be appreciated, chips that must be discarded because of a defect or defects increases the cost of all the remaining usable chips.

A single semiconductor wafer can require numerous processing steps such as oxidation, etching, metallization and wet chemical cleaning. Some of these processing steps involve placing the wafer on which the semiconductor chips are being manufactured into different tools during the manufacturing process. The optimization of each of these processing steps requires an understanding of a variety of chemical reactions and physical processes in order to produce high performance, high yield circuits. The ability to view and characterize the surface and interface layers of a semiconductor chip in terms of their morphology, chemical composition and distribution are invaluable aids to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to decrease the yield. In order to develop high yield semiconductor processes and to improve existing ones, it is important to identify the sources of the various particles that cause defects and then to prevent the tools from dropping these particles onto the wafer while the wafers are in the tools.

One approach used to identify the source of the particles is to analyze the particles as they lie on the wafer surface. A number of particle detectors have been developed to measure the number, location, and the size of the particles on the wafer surface. One type of particle detector is known as the laser surface particle detector (LSPD). However, the information provided by the LSPD, by itself, is sometimes not sufficient for identifying the source of the particles. In almost all cases, the particle must be further analyzed to identify what type of particle it is to assist in the determination of the source of the particle. A scanning electron microscope (SEM) equipped with an energy dispersive x-ray spectroscopy (EDS) system works well for measuring the morphology and chemical composition of particles. However, it is nearly impossible to find particles with a SEM on a relatively clean wafer surface. A technique was developed that uses a combination of various scan tools such as the LSPD to locate particles on the wafer surface and various review tools such as the SEM/EDS system to review and analyze the particles. One of the combined systems is known as the Particle Analysis System (PAS) and this system and similar systems are used throughout the semiconductor industry. The PAS has been effective in identifying most particle contamination problems. However, as chip technology has improved and device geometry has shrunk, the particles that can cause defects have also become smaller. This requires that the analysis system be able to detect and analyze smaller particles. The major problem in the analysis of small particles with a PAS or similar system is the problem of finding the particles with a review tool such as the SEM after a scan tool such as the LSPD has detected them. The limiting factor is the positioning accuracy of the LSPD, which may be insufficient to allow the SEM to use the minimum magnification necessary to see the particles. The current industry standard is that a minimum of 1500× magnification is usually required on the SEM in order to see a 0.16-micron particle. For a typical CRT screen, this magnification translates to a field of view of 70×70 microns. This means that a particle's position must be known with an error less than 35 to 40 microns in order for the SEM to find the particle. As the position error increases, analysis time is wasted searching for particles. When the position error exceeds 100 microns, an inordinate amount of time must be taken searching for particles.

A representative PAS system includes a Tencor 6200 LSPD and a JEOL 848 SEM equipped with a Kevex EDS. Typically, in such systems, a PC (personal computer) is used for data transfer between the LSPD and the SEM and for the manipulation of the data. The LSPD detects particles using a light scattering technique. The wafer is loaded into the LSPD chamber and the laser is raster-scanned over the wafer surface while the wafer is moved orthogonally to the scan direction. When the laser intersects a particle, light is scattered by the particle onto a detector. The magnitude of the light scattering signal provides information about the particle size. The measurement of the particle's position is more complicated. The position of the laser is known as a function of time and the scattering events produce a data file that contains the size and the x-y coordinates of each particle detected on the wafer surface. The wafer is then removed from the LSPD and loaded into a SEM. However, the coordinate system used by the x-y stage of the SEM is not the same as the coordinate system used by the LSPD. As a result, the wafer's orientation in the LSPD coordinate system differs from the wafer's orientation in the SEM's coordinate system. The PC must be able to transform the coordinate system used by the LSPD to the coordinate system used by the SEM.

To optimize the performance of PAS systems, it is necessary to improve the accuracy of particle position maps by reducing the targeting error. The targeting error is defined as the difference between particle positions predicted by the LSPD and the particle positions observed on the x-y stage. The source of nearly all the targeting error is caused by uncertainties in the LSPD particle map. A typical LSPD measures particle position with a resolution that exists as a rectangular region of 10 microns by 26 microns, however, this position is referenced to a less-accurately determined coordinate system. The coordinate system is aligned to the wafer in a specific orientation with respect to the wafer's center and notch positions. These positions are determined using a lower resolution (26 microns by 120 microns) measurement of the wafer's edge geometry. Ideally the alignment is insensitive to the wafer's orientation during scanning. From the uncertainties produced by resolution limits, it is expected that the LSPD will provide a relatively accurate particle position map, but one that is referenced to a significantly misaligned coordinate system. Therefore, a key step in the prior art in reducing the targeting error is to eliminate coordinate system misalignment. Another method in the prior art for reducing targeting error involves averaging multiple particle position maps to reduce the influence of random uncertainties.

As the design rules of semiconductor manufacturing processes require semiconductor devices to achieve even higher densities, as more layers and interlayer dependencies are added, and as processes become increasingly complex, the role of miniscule optically unresolvable defects will move to the forefront of yield limiting problems. These defects are caught and reported by a variety of scan tools at various layers or operations in a semiconductor process flow. Since these scan tools have a specific purpose, that is, finding defects, they are generally poor at analyzing the defects caught. Another set of tools, including SEM, TEM, Auger, FIB, high-resolution optical microscopes, UV scopes are used to analyze the defects caught by the scan tools. The purpose of the two sets of tools is to quickly determine the root cause and elimination of defects.

Current practice in the semiconductor industry for finding and assigning locations to defects caught by a scan tool is non-standard and inconsistent with each individual equipment vendor developing techniques as varied as the tools are themselves. Some systems align themselves to a reticle pattern on the wafer, positioning all defects caught in relation to an absolute 0,0 die location which is arbitrarily assigned based on the original alignment position selected by the person who sets up the recipe to be the center. Other systems assign the 0.0 location such that all die are described as being in the positive x,y, quadrant. Other systems attempt to find the exact center of a wafer by performing a 3 point alignment using the edges of the wafer and using geometry to find the center. Many, if not all of these methods do not attempt to take into account the orientation of the notch (or wafer flat) when assigning their coordinate systems. Also, many of these systems are not accurate enough to place the defect within the tolerances needed for many CIM base yield models, or for recapture on a high magnification analysis tool.

The problem of trying to recapture a defect on an analysis tool that was originally caught by a scan tool still exists. Since, for the most part, defects are arbitrarily "placed" by a scan tool with a totally independent coordinate system, it is virtually impossible for an analysis tool to recapture the defects without many frustrated hours of attempts to "align" the wafer to the coordinate system used by the analysis tool. Many algorithms have been developed to translate one coordinate system to another, but these are not perfect and are considered bandages to the overall problem. This requires, however, that the vendor of an analysis tool must provide a translation algorithm for each scan tool that may be used to scan for defects.

Currently, the location and other information concerning the captured defects are stored in files for later recapture and analysis of the defects. These files are stored in a relational database that has the ability to generate wafer maps with defects shown in their relative positions. The database also has the ability to send these wafer map files to various review tools within the fabrication facility. The ability to do this is useful as it allows for re-inspection on various tools with the fabrication facility such as Optical Microscopes, SEMs, and FIBs that allows for classification of the defects. Pictures taken on these various after-scan analysis tools can be linked to a defect on a wafer map and reviewed at a workstation at an engineer or technician's convenience.

One problem that still exists with all of the above detection and analysis systems is the lack of standardization between various scan tool equipment vendors. This causes a lack of calibration between the various tools and the inability to determine the exact x-y location of defects, to determine the exact rotational or skew errors or to determine the exact linear translational offsets. This lack of calibration causes alignment or registration problems when transferring defect data from one format to another across the various analytical tools available. This lack of calibration is such that finding defects on these various media ranges from difficult to impossible. The problem can be understood when considering that defects to be analyzed by these analytical tools can be in the range of 0.1 $\mu$m with the field of view available to see such a defect being in the range of several tens of microns. If the scanning tool and the reviewing tool are not calibrated to within a few microns, recapturing defects becomes not only time consuming but frustrating as well unless the defect lies within the limited range available. Additionally, some defects such as buried defects caught by an optical or laser scan tool can be invisible to an electron scanning system.

Many times a single operator on an analytical review tool becomes proficient with being able to receive a certain format defect file and finding defects on that particular tool. That operator has found, by a process of trial and error, the sequence of events or the process necessary to align the defect file with the tool. This process is not easily assimilated among the operators, especially when those users are scattered across different shifts and among various workgroups. In other situations, the vendor may be able to use the tool to find anomolies but that technique is not easily transferred to the users.

Therefore, what is needed is a system that will translate the various defect file formats for use with a particular analytical tool. The translation information would be an offset for each scan tool or review tool that would include any stage movement anomalies, alignment sites, skew, runout, or other systematic differences between a particular scan tool and analytical tool.

SUMMARY OF THE INVENTION

According to the present invention, the foregoing and other objects and advantages are attained by a method of analyzing defects in a semiconductor manufacturing process by removing position offset of a selected scanning tool from the defect location information and adding position offset of a selected review analysis tool to the defect location information.

In accordance with an aspect of the invention a production lot of wafers is sent through a manufacturing process, a selected wafer is scanned for defects in a selected scanning tool, defect location information for caught defects is sent to a defect management system where offset information for the scanning tool is removed from the defect location information and offset information for a selected analysis review tool is added to the defect location information.

In accordance with another aspect of the invention, offset information for the selected scanning tool and offset information for the selected analysis review tool are stored in an offset database.

In accordance with another aspect of the invention, offset information for the selected scanning tool and offset information for the selected analysis review tool are generated at a workstation connected to the offset database.

In accordance with still another aspect of the invention, the offset information for the selected scanning tool and the selected review analysis tool includes information concerning stage movement anomalies, alignment sites, skew, runout, or other systematic differences for the selected scanning or analysis review tool.

The described method thus effectively provides a method of quickly and accurately analyzing defects in a semiconductor manufacturing process wherein offset information of a selected scanning tool is removed from the defect location information and position offset of a selected review analysis tool is added to the defect location information.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
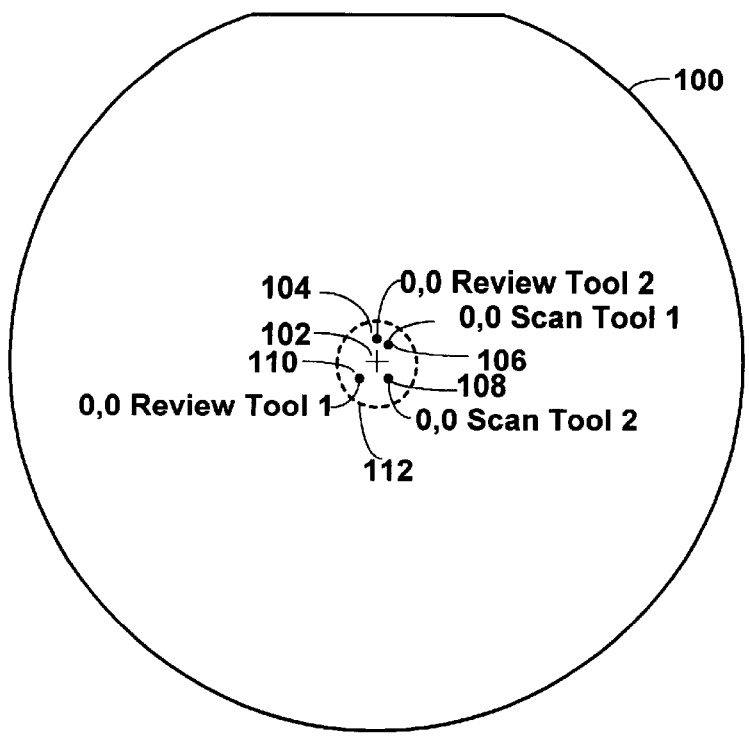
FIG. 1 shows a wafer, the wafers true coordinate center, two coordinate centers for two different scan tools and two coordinate centers for two different review tools.

FIG. 1 shows a wafer 100 having a true coordinate center represented by the cross at 102, an xy coordinate center 0,0 104 for a review tool 2, an xy coordinate center 0,0 106 for a scan tool 1, an xy coordinate center 0,0 108 for a scan tool 2, and an xy coordinate center 0,0 110. The various coordinate centers are the centers that the various scan tools and review tools use as the xy coordinate center for locating defects. The portion of the wafer within the dotted line 112 is shown expanded in FIG. 2.

Figure 2:
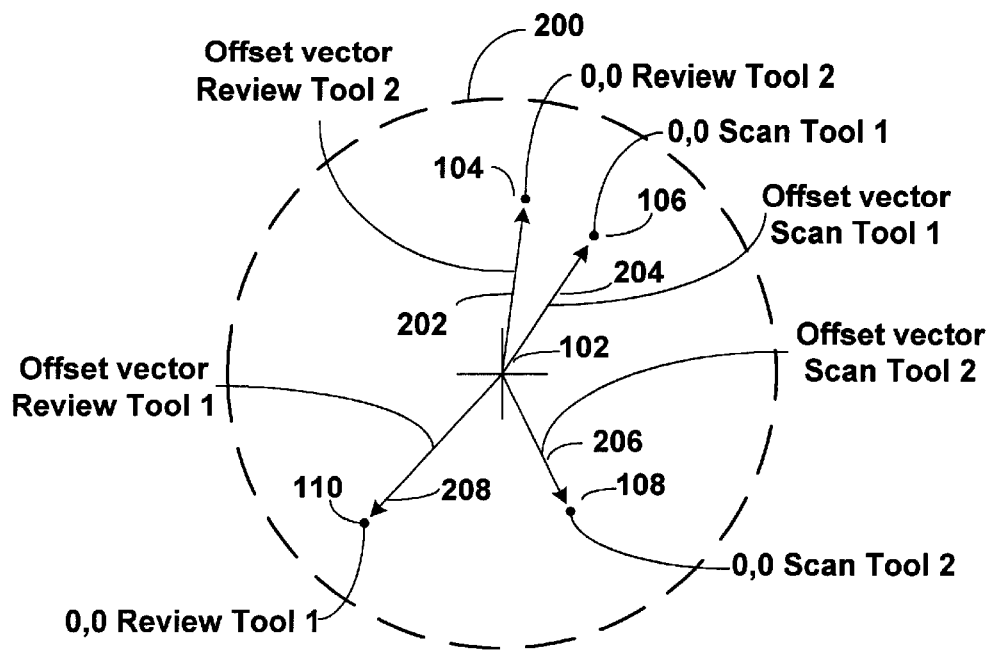
FIG. 2 shows an expanded portion of the wafer shown in FIG. 1 showing offset vectors to the two coordinate centers for the two different scan tools and for the two coordinate centers for the two different review tools.

FIG. 2 shows an expanded portion 200 of the portion of the wafer within the dotted line 112 shown in FIG. 2. An offset vector 202 is shown from the center 102 to the xy coordinate center 0,0 104 of the review tool 2. An offset vector 204 is shown from the center 102 to the xy coordinate center 0,0 106 of the scan tool 1. An offset vector 206 is shown from the center 102 to the xy coordinate center 0,0 108 of the scan tool 2. An offset vector 208 is shown from the center 102 to the xy coordinate center 0,0 110 of the review tool 1. As can be seen, if defects found by the scan tool 1 are to be reviewed by review tool 2, the combined offsets is relatively small and it may be possible for the review tool 2 to find the defects found by scan tool 1. On the other hand, if defects found by scan tool 1 are to be reviewed by review tool 1, the combined offsets are much larger and it will be much more difficult for the review tool 1 to find the defects found by scan tool 1. The time spent locating the defects is increased in this instance detracts from the processing time for the production lot of wafers.

Figure 3:
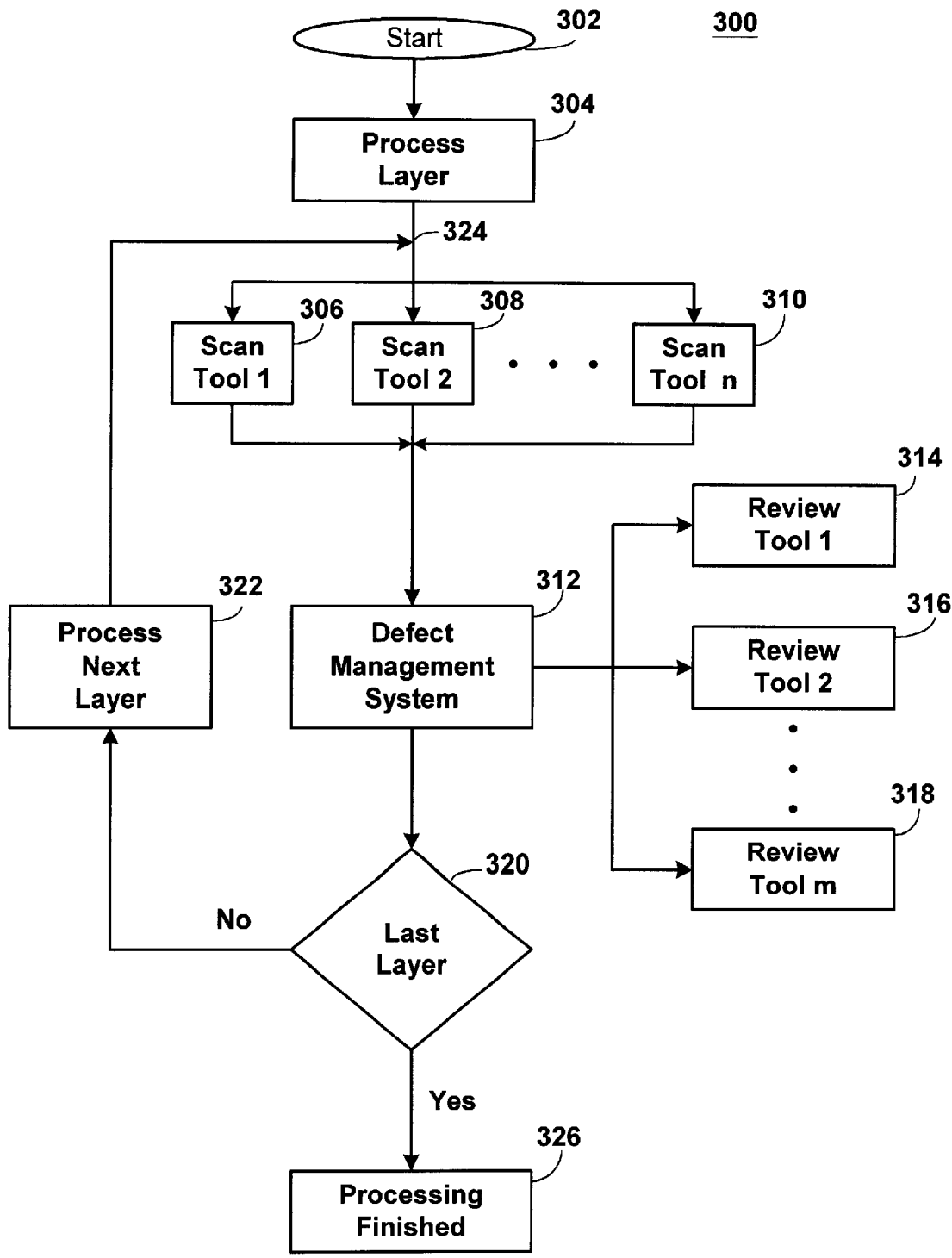
FIG. 3 is a flow diagram showing a manufacturing process for semiconductor wafers.

FIG. 3 is a portion 300 of a flow diagram of a typical semiconductor manufacturing process showing a methodology of scanning wafers for defects in one of a number of scan tools and reviewing captured defects in one of a number of review tools. Production lot of wafers are processed one at a time and a production lot typically includes approximately 25 wafers. The manufacturing process typically involves the processing of multiple layers on each wafer, however, the processing of only one layer will be described herein. The manufacturing process for a layer starts at 302 and the layer of the wafer is processed at 304. After the layer of the production lot of wafers is processed at 304, an inspection wafer is selected from the production lot and is placed in one of a number of scan tools, Scan Tool 1 306, Scan Tool 2 308 and scan tools up to Scan Tool n 310. The scan tool in which the selected inspection wafer is placed scans the inspection wafer and captures defects by determining their location. The defect location information is forwarded to a defect management system (DMS) at 312. To analyze the defects, the inspection wafer is placed in one of a number of analysis review tools, Review Tool 1 314, Review Tool 2 316 and scan tools up to Review Tool m 318. The analysis review tools make an image of each of the defects and the images are stored by the defect management system 312 in a database (not shown). The analysis review tools 314, 316 & 318 locate the defects using the location information from the defect management system 312, examine the defects at high magnification and make images of the defects. The images of the defects are then sent to the defect management system 312. As discussed above, the location information is inaccurate because of the differing coordinate systems used by each of the scan tools and review tools.

After the analysis review tools are finished analyzing the defects, it is determined at 320 whether the layer just processed is the last layer. If the layer just processed is not the last layer, the next layer is processed at 322 and the production lot of wafers is then returned to the manufacturing flow at 324 and the process described above is repeated for the next layer. If it is determined at 320 that the layer just processed is the last layer, the wafer is finished as indicated at 326.

Figure 4:
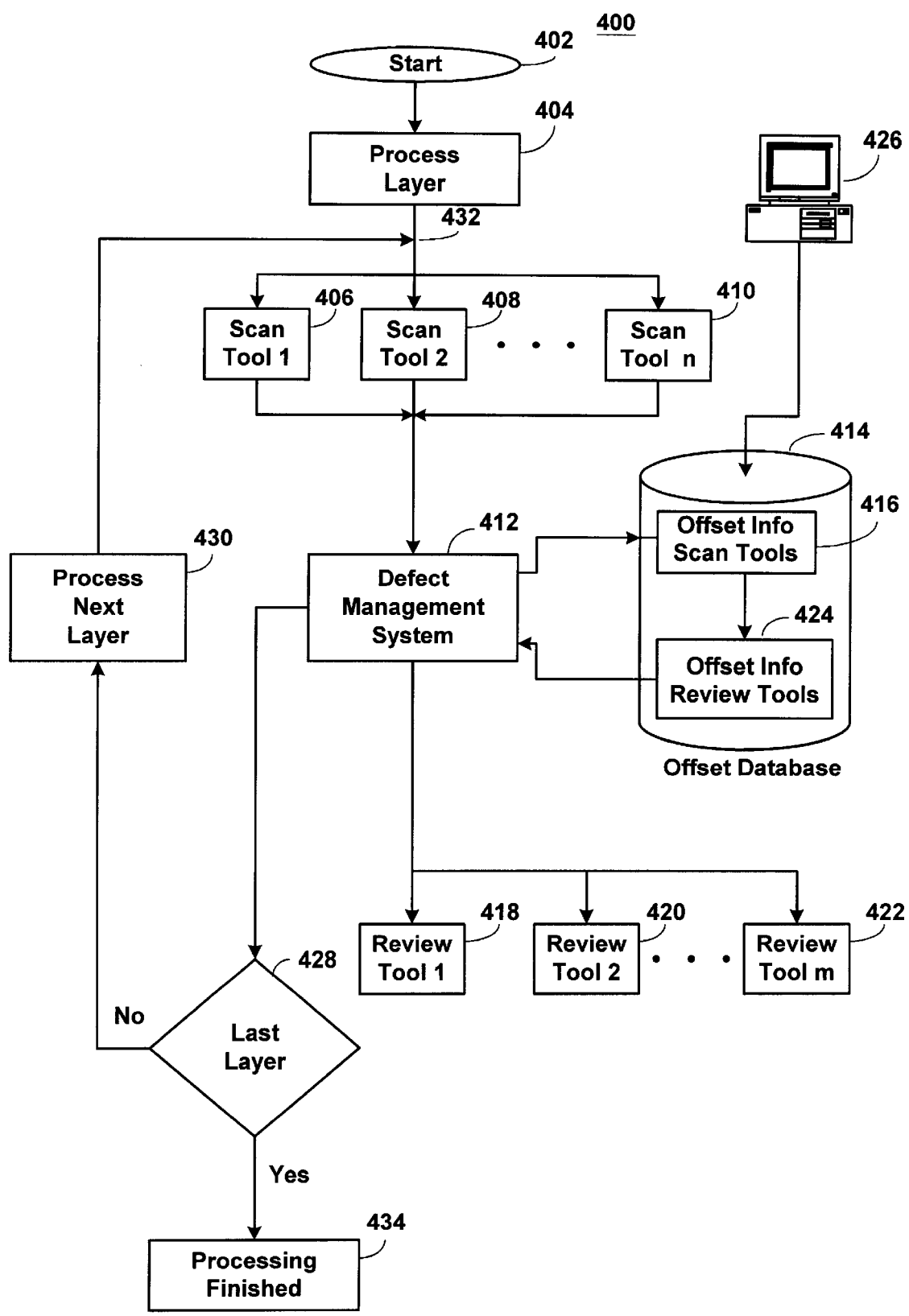
FIG. 4 is a flow diagram showing a manufacturing process for semiconductor wafers in accordance with the present invention showing a method for applying offset information to data from scan tools and for applying offset information to review tools.

FIG. 4 is a portion 400 of a flow diagram of a semiconductor manufacturing process showing a methodology of scanning wafers for defects in one of a number of scan tools and reviewing captured defects in one of a number of review tools utilizing offset data to accurately locate defects for review and analysis. Production lots of wafers are processed one at a time and a production lot typically includes approximately 25 wafers. The manufacturing process typically involves the processing of multiple layers on each wafer, however, the processing on only one layer will be described herein. The manufacturing process for a layer starts at 402 and the layer of the wafer is processed at 404. After the layer of the production lot of wafers is processed at 404, an inspection wafer is selected from the production lot and is placed in one of a number of scan tools, Scan Tool 1 406, Scan Tool 2 408, and scan tools up to Scan Tool n 410. The scan tool in which the selected inspection wafer is placed scans the inspection wafer and captures defects by determining their location. The defect location information is forwarded to a defect management system (DMS) at 412. The defect management system 412 sends the defect location information to an Offset Database 414 where the defect location information is combined with offset information 416 for the particular scan tool that was used to detect the defects. The offset information causes the defect location information to be stored so that the location information is stored relative to the true xy coordinate 0,0 102 (FIGS. 1 & 2). To analyze the defects, the inspection wafer is placed in one of a number of analysis review tools, Review Tool 1 418, Review Tool 2 420 and scan tools up to Review Tool m 422. The defect management system 412 and the Offset Database 414 cooperate to add offset data 424 to the defect location for the scan tool selected by the defect management system 412. The offset data is applied to the defect location before the defect location is sent to the selected scan tool. The offset information applied to the defect location information allows the review tool to locate the defects by compensating for the offset caused by the scan tool not using the true xy coordinate center 102 (FIGS. 1 & 2). The offset information for the scan and review tools is input to the offset database 414 by an operator at the workstation 426. The offset information is determined by calibrating each scan and review tool to determine the vectors 204, 206 & 208 (FIG. 2). Once the vectors 204, 206 & 208 are determined, the offset data can then be determined. The selected analysis review tool can then locate the defects accurately with the offset applied. The analysis review tool examines the defects at high magnification and makes images of the defects. The images of the defects are then sent to the defect management system 412.

After the analysis review tool has finished analyzing the defects, it is determined at 428 whether the layer just processed is the last layer. If the layer just processed is not the last layer, the next layer is processed at 430 and the production lot of wafer is then returned to the manufacturing flow at 432 and the process described above is repeated for the next layer. If it is determined at 428 that the layer just processed is the last layer, the wafer is finished as indicated at 434.

The benefits of the invention include:

1. The elimination of wasted time to locate defects in an analysis tool.
2. The efficient transfer and retention of expert knowledge.
3. The efficient utilization of equipment.
4. The efficient utilization of engineering effort.

In summary, the results and advantages of the method of the present invention can now be more fully realized. The described method effectively provides a method of quickly and accurately analyzing defects in a semiconductor manufacturing process wherein offset information of a selected scanning tool is removed from the defect location information and position offset of a selected review analysis tool is added to the defect location information. This allows the selected review analysis tool to quickly and accurately locate and analyze defects.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of analyzing defects in a semiconductor manufacturing process, the method comprising the steps of:

sending a production lot of wafers through a manufacturing process;

scanning a selected wafer from the production lot of wafers for defects in a selected scanning tool;

sending location information for defects caught during the step of scanning to a defect management system;

combining the location information for defects caught during the step of scanning with offset information for the selected scanning tool to obtain accurate scanning tool defect location information;

selecting a review analysis tool to review the accurate scanning tool defect location information;

combining the accurate scanning tool defect location information with offset information for the selected review analysis tool to obtain accurate review tool defect location information for the selected review analysis tool; and analyzing in the selected review analysis tool the defects caught during the step of scanning using the accurate review tool defect location information for the selected review analysis tool.

2. The method of claim 1 further comprising the steps of storing offset information for the selected scanning tool in an offset database and storing offset information for the selected review analysis tool in the offset database.

3. The method of claim 2 further comprising the steps of generating the offset information for the selected scanning tool and the selected review analysis tool at a workstation connected to the offset database.

4. The method of claim 3 wherein the steps of generating the offset information for the selected scanning tool and the selected review analysis tool includes including information concerning stage movement anomalies, alignment sites, skew, runout, or other systematic differences for the selected scanning tool and the selected analysis review tool.

5. The method of claim 4 wherein the step of combining the location information for defects caught during the step of scanning with offset information for the selected scanning tool comprises removing the offset information from the location information for defects wherein the accurate scanning tool defect location information uses an xy coordinate system based on a true xy coordinate system.

6. The method of claim 5 wherein the step of combining the accurate scanning tool defect location information with offset information for the selected review analysis tool comprises adding the offset information for the selected review analysis tool wherein the accurate review tool defect location information uses an xy coordinate system based on the selected review tool xy coordinate system.

\* \* \* \* \*